(12) United States Patent
Takagi

(10) Patent No.: US 11,382,238 B2
(45) Date of Patent: Jul. 5, 2022

(54) COOLING DEVICE AND PROJECTOR

(71) Applicant: SEIKO EPSON CORPORATION, Tokyo (JP)

(72) Inventor: Kunihiko Takagi, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 194 days.

(21) Appl. No.: 16/818,005

(22) Filed: Mar. 13, 2020

(65) Prior Publication Data
US 2020/0296859 A1    Sep. 17, 2020

(30) Foreign Application Priority Data

Mar. 14, 2019  (JP) .............................. JP2019-046836

(51) Int. Cl.
| | | |
|---|---|---|
| *H05K 7/20* | (2006.01) | |
| *F28D 15/02* | (2006.01) | |
| *G03B 21/16* | (2006.01) | |
| *F28D 15/04* | (2006.01) | |
| *F25B 39/02* | (2006.01) | |
| *F28D 21/00* | (2006.01) | |

(52) U.S. Cl.
CPC ....... *H05K 7/20336* (2013.01); *F25B 39/022* (2013.01); *F28D 15/0266* (2013.01); *F28D 15/043* (2013.01); *G03B 21/16* (2013.01); *H05K 7/20309* (2013.01); *H05K 7/20318* (2013.01); *F28D 2015/0216* (2013.01); *F28D 2015/0225* (2013.01); *F28D 2021/0064* (2013.01)

(58) Field of Classification Search
CPC ............ H05K 7/20309; H05K 7/20336; F28D 15/0266; F28D 2021/0064; F25B 39/022; G03B 21/16

See application file for complete search history.

(56) References Cited

U.S. PATENT DOCUMENTS

| | | | | |
|---|---|---|---|---|
| 5,558,155 A | * | 9/1996 | Ito ........................ | B23K 1/0012 |
| | | | | 174/16.3 |
| 6,449,160 B1 | * | 9/2002 | Tsai ..................... | H01L 23/3672 |
| | | | | 174/16.3 |
| 6,474,407 B1 | * | 11/2002 | Chang ................. | H01L 23/3672 |
| | | | | 165/185 |

(Continued)

FOREIGN PATENT DOCUMENTS

| | | |
|---|---|---|
| CN | 1805133 A | 7/2006 |
| CN | 215301269 U   * | 12/2021 |

(Continued)

*Primary Examiner* — Robert J Hoffberg
(74) *Attorney, Agent, or Firm* — Oliff PLC

(57) ABSTRACT

A cooler includes an evaporator and a condenser. The evaporator includes a housing, a wick, and a groove member having a plurality of vapor flow channels through which working fluid changed in phase from a liquid phase to a gas phase flows, the groove member being coupled to the wick. The housing includes a heat receiver to which the heat is transferred from a cooling target. The groove member includes a plurality of plate-like members, arranged side by side along a predetermined direction, and constituting the plurality of vapor flow channels. Each of the plate-like members includes a bent part formed by bending a part of the plate-like member, the bent part being coupled to the heat receiver.

11 Claims, 10 Drawing Sheets

(56) References Cited

U.S. PATENT DOCUMENTS

| | | | |
|---|---|---|---|
| 6,639,802 B1* | 10/2003 | Dong | H01L 23/3672 257/722 |
| 6,672,379 B1* | 1/2004 | Wang | F28F 3/02 257/722 |
| 6,901,993 B2* | 6/2005 | Lee | H01L 23/3672 174/16.3 |
| 6,995,981 B2* | 2/2006 | Huang | H01L 23/3672 257/722 |
| 7,980,295 B2* | 7/2011 | Takamatsu | F28D 15/043 165/104.26 |
| 8,033,017 B2* | 10/2011 | Kim | F28D 15/0266 29/890.032 |
| 8,780,560 B2 | 7/2014 | Ogata et al. | |
| 9,261,761 B2* | 2/2016 | Kuriaki | G03B 21/005 |
| 10,234,213 B2* | 3/2019 | Dupont | F28D 15/043 |
| 10,443,951 B2* | 10/2019 | Kusano | F28D 15/046 |
| 10,838,287 B2* | 11/2020 | Shimizu | F28D 15/0266 |
| 10,877,361 B2* | 12/2020 | Aoki | G03B 21/16 |
| 10,955,733 B2* | 3/2021 | Shimizu | F28D 15/0233 |
| 11,061,309 B2* | 7/2021 | Takagi | H05K 7/20327 |
| 2004/0150955 A1* | 8/2004 | Lin | F28F 3/02 361/709 |
| 2005/0022972 A1* | 2/2005 | Cheng-Tung | F28F 3/02 257/E23.103 |
| 2009/0314472 A1* | 12/2009 | Kim | F28D 15/043 165/104.26 |
| 2010/0186931 A1 | 7/2010 | Obara et al. | |
| 2010/0300656 A1* | 12/2010 | Lu | F28D 15/043 165/104.26 |
| 2013/0044432 A1 | 2/2013 | Ogata et al. | |
| 2015/0369541 A1* | 12/2015 | Dupont | F28D 15/043 165/104.26 |
| 2018/0209745 A1* | 7/2018 | Tsai | F28D 15/043 |
| 2020/0050092 A1* | 2/2020 | Shimizu | H04N 9/3144 |

FOREIGN PATENT DOCUMENTS

| | | |
|---|---|---|
| JP | 2007-247931 A | 9/2007 |
| JP | 2012-083082 A | 4/2012 |
| JP | 2012-193912 A | 10/2012 |
| JP | 2013-040718 A | 2/2013 |
| JP | 2014-114963 A | 6/2014 |
| JP | 2015-087089 A | 5/2015 |
| JP | 2018-110200 A | 7/2018 |
| WO | 2006/074583 A1 | 7/2006 |
| WO | WO-2006074583 A1 * | 7/2006 ............ F28D 15/046 |
| WO | 2008/153071 A1 | 12/2008 |

* cited by examiner

COOLING DEVICE AND PROJECTOR

The present application is based on, and claims priority from JP Application Serial Number 2019-046836, filed Mar. 14, 2019, the disclosure of which is hereby incorporated by reference herein in its entirety.

BACKGROUND

1. Technical Field

The present disclosure relates to a cooler and a projector.

2. Related Art

In the past, as a cooler for electronic equipment or the like, there has been known a loop heat pipe for transferring heat taken from a heat source and then releasing the heat using a phase change of a working fluid in a closed space. For example, in JP-A-2012-83082 (Document 1), there is disclosed a loop heat pipe provided with a plurality of grooves each forming a vapor flow channel. Further, in JP-A-2012-193912 (Document 2), there is disclosed a loop heat pipe in which a groove through which a working fluid in a gas phase flows is disposed adjacent to a wick.

However, in the loop heat pipes described in Document 1 and Document 2, there is a problem that it is difficult to achieve both of a decrease in thermal resistance and an increase in amount of heat which can be cooled. In detail, as a constituent material of the groove, there is adopted metal generally from a viewpoint of the thermal conductivity. In cut working of a metal material, it is difficult to form grooves relatively large in depth of the vapor flow channel, and relatively small in pitch. Firstly, when forming the grooves relatively small in pitch, the depth of the vapor flow channel becomes relatively small, and as a result, the cross-sectional area of the vapor flow channel becomes relatively small. Therefore, a pressure loss occurring when the working fluid in the gas phase changed from the working fluid in the liquid phase due to the heat transferred from the heat source flows through the vapor flow channel increases. Thus, the evaporating pressure of the working fluid increases to raise the evaporation temperature, and thus, the thermal resistance of the loop heat pipe increases.

On the other hand, when forming the grooves relatively large in depth of the vapor flow channel in order to reduce the pressure loss occurring when the working fluid in the gas phase flows through the vapor flow channel, the pitch of the grooves also becomes relatively large, and thus, the wall surface constituting the groove decreases. Therefore, the region for the working fluid in the liquid phase in the groove to evaporate, in other words, the evaporation area decreases as a result. As a result, an amount of evaporation in the groove decreases, and the amount of heat which can be cooled by the loop heat pipe decreases. Therefore, in the related-art loop heat pipe, it is difficult to achieve both of the decrease in the thermal resistance and the increase in amount of heat which can be cooled. Therefore, there has been demanded a cooler of a loop heat pipe type which achieves both of the decrease in thermal resistance and the increase in amount of heat which can be cooled.

SUMMARY

A cooler according to the present disclosure includes an evaporator configured to evaporate working fluid in a liquid phase with a heat transferred from a cooling target to change to the working fluid in a gas phase, a condenser configured to condense the working fluid in the gas phase to change to the working fluid in the liquid phase, a vapor pipe configured to make the working fluid changed in phase to the gas phase in the evaporator flow into the condenser, and a liquid pipe configured to make the working fluid changed in phase to the liquid phase in the condenser flow into the evaporator, wherein the evaporator includes a housing which is coupled to the liquid pipe, and into which the working fluid in the liquid phase inflows, a wick disposed in the housing, soaked with the working fluid in the liquid phase, and configured to transport the working fluid in the liquid phase, and a groove member having a plurality of vapor flow channels through which the working fluid changed in phase from the liquid phase to the gas phase flows, and coupled to the wick, the housing includes a heat receiver to which the heat is transferred from the cooling target, the groove member includes a plurality of plate-like members made of metal, arranged side by side along a predetermined direction, and constituting the plurality of vapor flow channels, and each of the plate-like members includes a bent part formed by bending a part of the plate-like member, and coupled to the heat receiver.

In the cooler described above, the plurality of plate-like members may be higher in thermal conductivity than the wick.

In the cooler described above, the plate-like member may have a rectangular shape having long sides and short sides, the bent part may be disposed on one of the long sides, another of the long sides may be coupled to the wick, and a length of the short sides may be larger than a distance at which the plurality of plate-like members are arranged along the predetermined direction.

In the cooler described above, the groove member may be constituted by the bent part of one of the plate-like members and another of the plate-like members adjacent to the one of the plate-like members coupled to each other.

In the cooler described above, an evaporation promoter configured to increase the contact area between the working fluid in the liquid phase and the groove member may be provided to at least one of the plurality of plate-like members.

In the cooler described above, the evaporation promoter may include a groove.

In the cooler described above, the evaporation promoter may have a mesh-like shape.

A projector according to the present disclosure includes a light source device having a light source configured to emit light, a light modulator configured to modulate light emitted from the light source device, a projection optical device configured to project the light modulated by the light modulator, and any one of the coolers described above.

In the projector described above, the cooling target may be the light source.

DESCRIPTION OF EXEMPLARY EMBODIMENTS

Some embodiments of the present disclosure will hereinafter be described with reference to the drawings. The embodiments described hereinafter are each for explaining an example of the present disclosure. The present disclosure is not at all limited to the following embodiments, but includes a variety of types of modified examples implemented within the scope or the spirit of the present disclosure. Here, in each of the drawings described below, the scale sizes of the members are made different from the actual dimensions in order to describe the members in recognizable dimensions.

1. First Embodiment

In the present embodiment, the description will be presented citing a projector provided with a loop heat pipe the cooling target of which is a light source as a cooler. A configuration of the projector according to the present embodiment will be described with reference to the drawings.

1.1. Configuration of Projector

Figure 1:
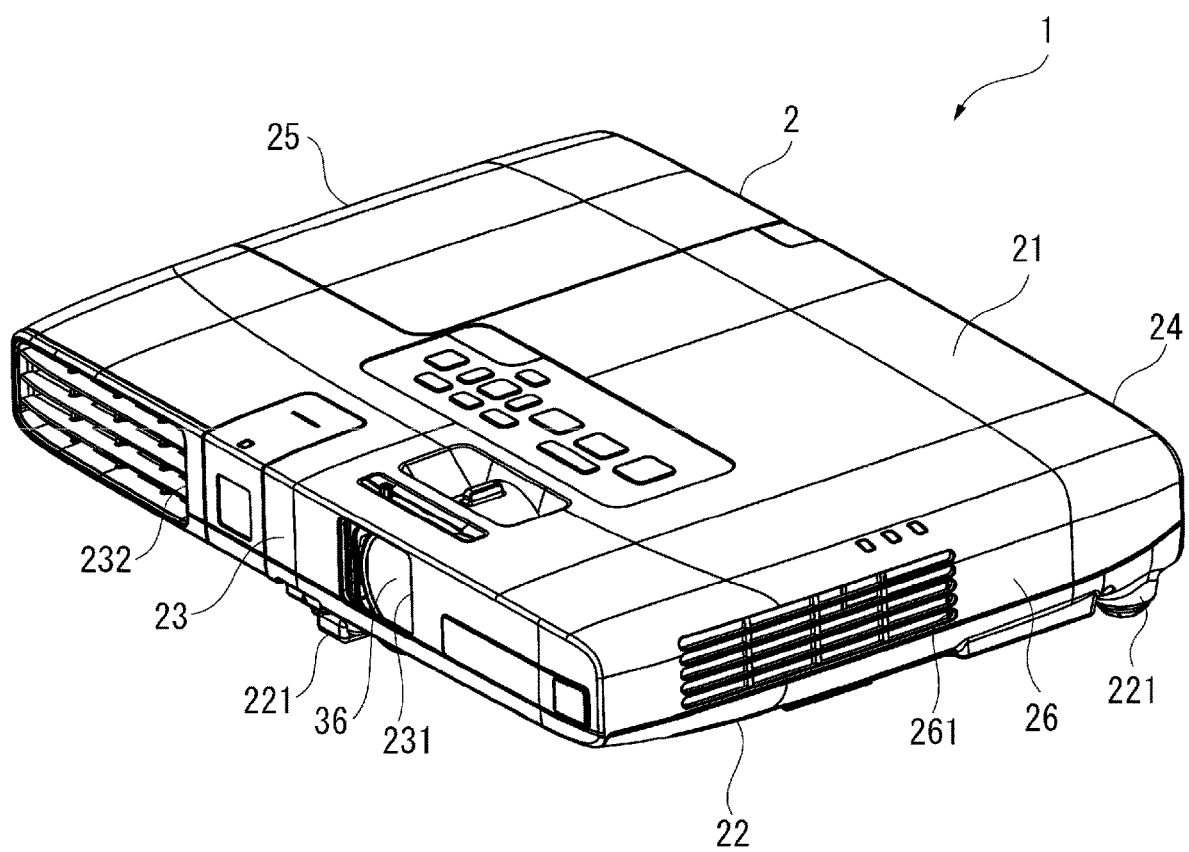
FIG. 1 is a perspective view showing an appearance of a projector according to a first embodiment.

FIG. 1 is a perspective view showing an appearance of a projector 1 according to a first embodiment. The projector 1 according to the present embodiment is an image display device for modulating the light emitted from a light source device 4 described later to form an image corresponding to image information, and then projecting the image thus formed on a projection target surface such as a screen in an enlarged manner. As shown in FIG. 1, the projector 1 is provided with an exterior housing 2 constituting the exterior of the projector 1.

1.1.1. Configuration of Exterior Housing

The exterior housing 2 has a top surface part 21, a bottom surface part 22, a front surface part 23, a back surface part 24, a left side surface part 25, and a right side surface part 26, and is formed to have a substantially rectangular solid shape. The bottom surface part 22 has a plurality of leg parts 221 having contact with an installation surface on which the projector 1 is mounted. The front surface part 23 is located on the image projection side in the exterior housing 2. The front surface part 23 has an opening part 231 for exposing a part of a projection optical device 36 described later, and an image to be projected by the projection optical device 36 passes through the opening part 231. Further, the front surface part 23 has an exhaust port 232 from which a cooling gas having cooled the cooling target inside the projector 1 is discharged to the outside of the exterior housing 2. The right side surface part 26 has an introduction port 261 from which a gas such as air located outside the exterior housing 2 is introduced inside as the cooling gas.

1.1.2. Internal Configuration of Projector

Figure 2:
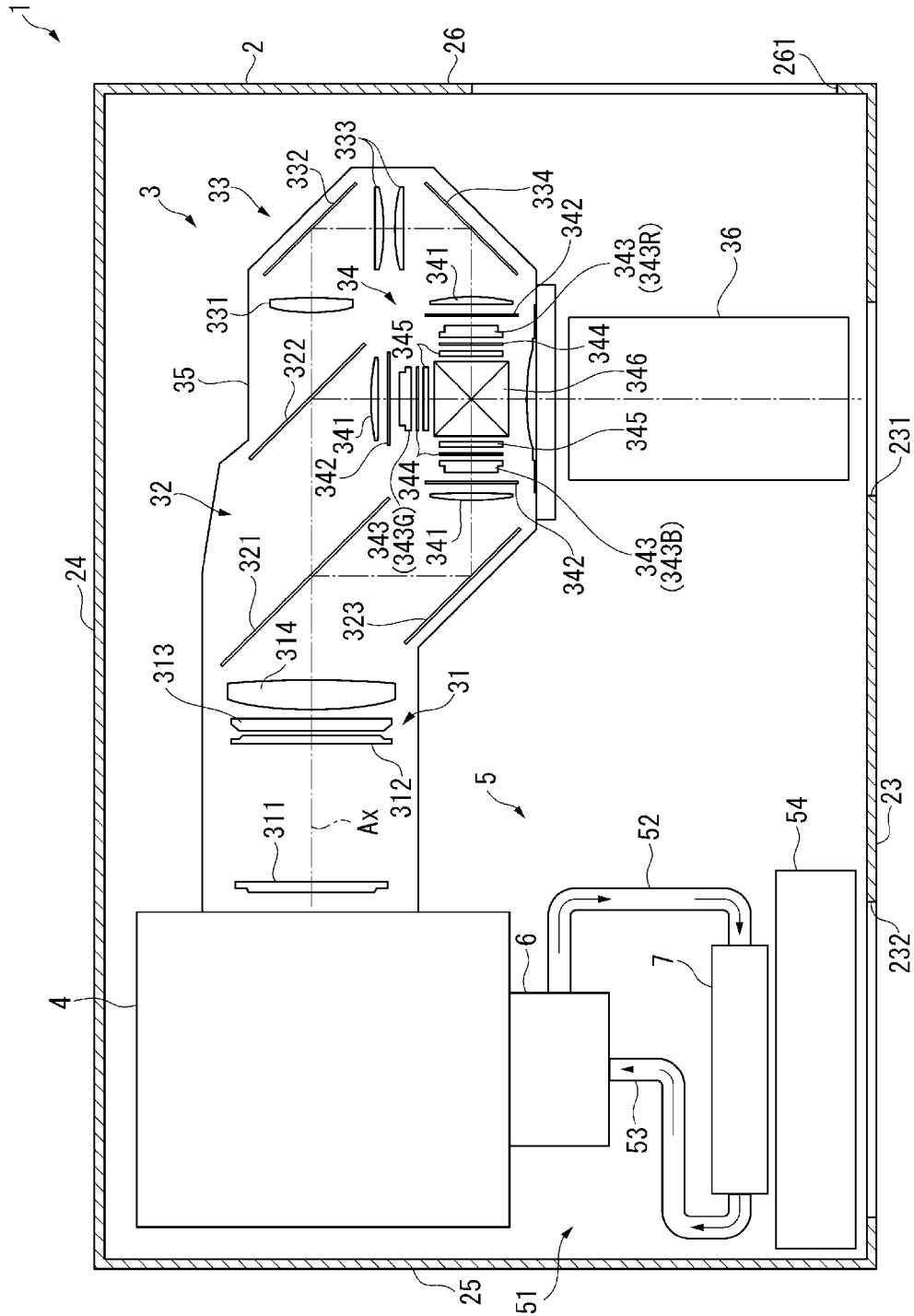
FIG. 2 is a schematic diagram showing an internal configuration of a projector.

FIG. 2 is a schematic diagram showing an internal configuration of the projector 1. As shown in FIG. 2, the projector 1 is further provided with an image projection device 3 and a cooler 5 each housed inside the exterior housing 2. Besides the above, although not shown in the drawing, the projector 1 is provided with a control device for controlling an operation of the projector 1, and a power supply device for supplying electronic components of the projector 1 with electrical power.

1.1.3. Configuration of Image Projection Device

The image projection device 3 forms and then projects the image corresponding to the image information input from the control device. The image projection device 3 is provided with the light source device 4, a homogenizing device 31, a color separation device 32, a relay device 33, an image forming device 34, an optical component housing 35, and the projection optical device 36. The light source device 4 emits illumination light. A configuration of the light source device 4 will be described later.

The homogenizing device 31 homogenizes the illumination light emitted from the light source device 4. The illumination light thus homogenized illuminates modulation areas of light modulators 343 described later of the image forming device 34 via the color separation device 32 and the relay device 33. The homogenizing device 31 is provided with two lens arrays 311, 312, a polarization conversion element 313, and a superimposing lens 314. The color separation device 32 separates the light having entered the color separation device 32 from the homogenizing device 31 into colored light beams of red, green, and blue. The color separation device is provided with two dichroic mirrors 321, 322 and a reflecting mirror 323 for reflecting the blue light beam having been separated by the dichroic mirror 321.

The relay device 33 is disposed on a light path of the red light beam longer than light paths of other colored light beams to suppress a loss of the red light beam. The relay device 33 is provided with an incident side lens 331, relay lenses 333, and reflecting mirrors 332, 334. It should be noted that in the present embodiment, the relay device 33 is disposed on the light path of the red light beam. However, this is not a limitation, and it is also possible to adopt a configuration in which, for example, the colored light beam longer in light path than other colored light beams is set as the blue light beam, and the relay device 33 is disposed on the light path of the blue light beam.

The image forming device 34 modulates each of the colored light beams of red, green, and blue having entered the image forming device 34, and combines the colored light beams thus modulated with each other to form the image. The image forming device 34 is provided with three field lenses 341, three incident side polarization plates 342, three light modulators 343, three view angle compensation plates 344, and three exit side polarization plates 345 each disposed in accordance with the respective colored light beams entering the image forming device 34, and a single color combining device 346.

The light modulators 343 each modulate the light emitted from the light source device 4 in accordance with the image information. The light modulators 343 include a light modulator 343R for the red light beam, a light modulator 343G for the green light beam, and a light modulator 343B for the blue light beam. In the present embodiment, the light modulators 343 are each formed of a transmissive liquid crystal panel, and the incident side polarization plate 342, the light modulator 343, and the exit side polarization plate 345 constitute a liquid crystal light valve.

The color combining device 346 combines the colored light beams respectively modulated by the light modulators 343B, 343G, and 343R with each other to form the image. In the present embodiment, the color combining device 346 is formed of a cross dichroic prism, but this is not a limitation, and it is also possible for the color combining device 346 to be formed of, for example, a plurality of dichroic mirrors.

The optical component housing 35 houses the devices 31 through 34 described above inside. It should be noted that an illumination light axis Ax as a design optical axis is set in the image projection device 3, and the optical component housing 35 holds the devices 31 through 34 at predetermined positions on the illumination light axis Ax. It should be noted that the light source device 4 and the projection optical device 36 are disposed at predetermined positions on the illumination light axis Ax.

The projection optical device 36 projects the image having entered the projection optical device 36 from the image forming device 34 on the projection target surface in an enlarged manner. In other words, the projection optical device 36 projects the light beams having respectively been modulated by the light modulators 343B, 343G, and 343R. The projection optical device 36 is configured as a combination lens having, for example, a plurality of lenses housed in a lens tube having a cylindrical shape.

1.1.4. Configuration of Light Source Device

Figure 3:
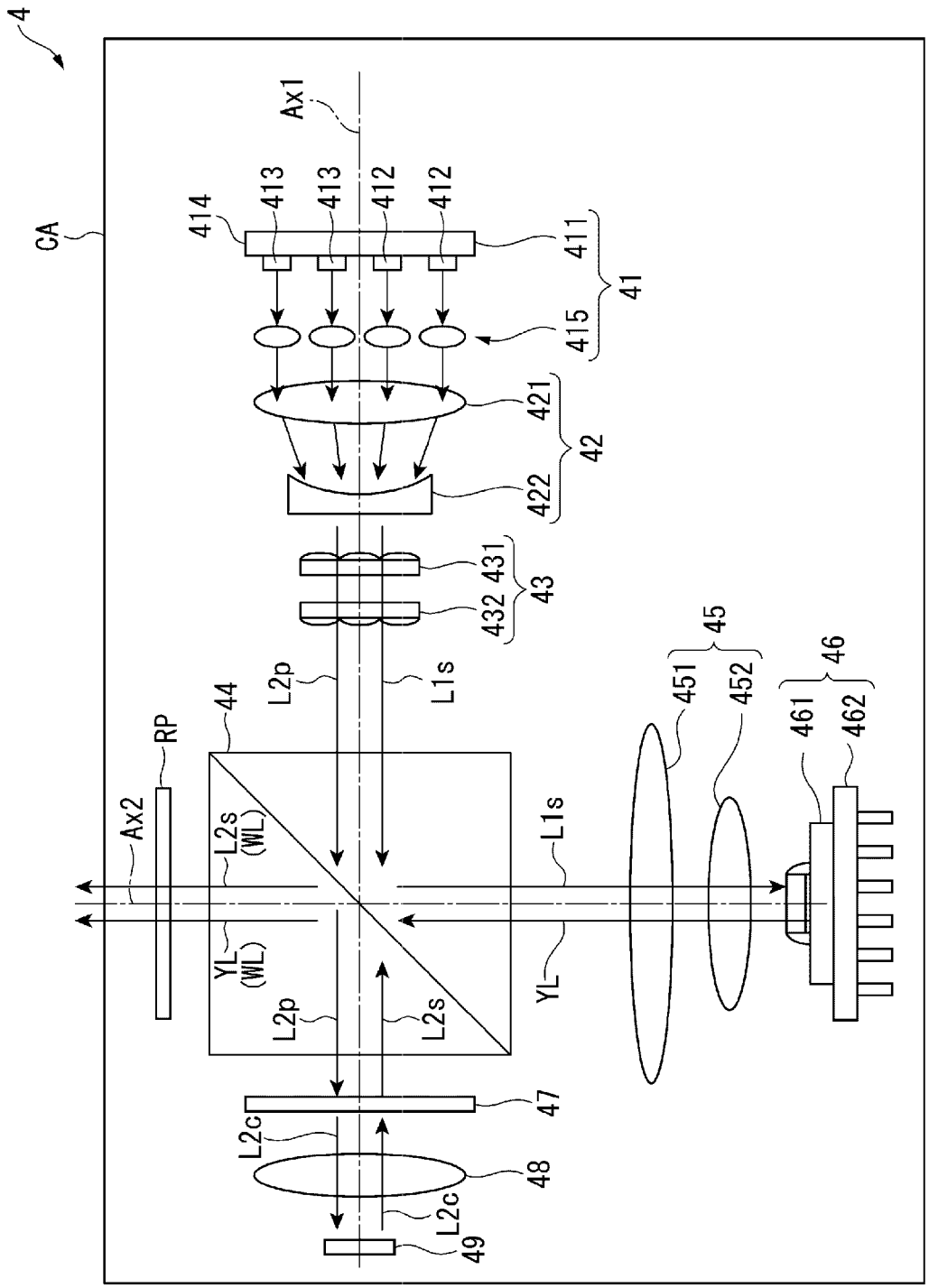
FIG. 3 is a schematic diagram showing a configuration of a light source device.

FIG. 3 is a schematic diagram showing a configuration of the light source device 4. The light source device 4 emits the illumination light to the homogenizing device 31. As shown in FIG. 3, the light source device 4 is provided with a light source housing CA, and a light source section 41, an afocal optical element 42, a homogenizer optical element 43, a polarization split element 44, a first light collection element 45, a wavelength conversion element 46, a first retardation element 47, a second light collection element 48, a diffusely reflecting device 49 and a second retardation element RP each housed inside the light source housing CA. The light source housing CA is configured as a sealed housing difficult for dust or the like to enter the inside the light source housing CA.

The light source section 41, the afocal optical element 42, the homogenizer optical element 43, the polarization split element 44, the first retardation element 47, the second light collection element 48, and the diffusely reflecting device 49 are arranged on an illumination light axis Ax1 set in the light source device 4. The wavelength conversion element 46, the first light collection element 45, the polarization split element 44, and the second retardation element RP are set in the light source device 4, and are arranged on an illumination light axis Ax2 perpendicular to the illumination light axis Ax1.

1.1.5. Configuration of Light Source Device

The light source section 41 is provided with a light source 411 for emitting the light, and collimator lenses 415. The light source 411 is provided with a plurality of first semiconductor lasers 412 and a plurality of second semiconductor lasers 413, and a support member 414. The first semiconductor lasers 412 each emit blue light L1$s$, which is s-polarized light, as excitation light. The blue light L1$s$ is, for example, a laser beam with a peak wavelength of 440 nm. The blue light L1$s$ having been emitted from the first semiconductor lasers 412 enters the wavelength conversion element 46. The second semiconductor lasers 413 each emit blue light L2$p$, which is p-polarized light. The blue light L2$p$ is, for example, a laser beam with a peak wavelength of 460 nm. The blue light L2$p$ having been emitted from the second semiconductor lasers 413 enters the diffusely reflecting device 49.

The support member 414 supports the plurality of first semiconductor lasers 412 and the plurality of second semiconductor lasers 413 each arranged in an array in a plane perpendicular to the illumination light axis Ax1. The support member 414 is a member made of metal having thermal conductivity, and is coupled to an evaporator 6 described later. Thus, the heat of each of the semiconductor lasers 412, 413 as a heat source, namely the heat of the light source 411, is transferred to the evaporator 6.

The blue light L1$s$ having been emitted from the first semiconductor lasers 412 and the blue light L2$p$ having been emitted from the second semiconductor lasers 413 are converted by the collimator lenses 415 into parallel light beams, and then enter the afocal optical element 42. It should be noted that in the present embodiment, the light source 411 has a configuration of emitting the blue light L1$s$ as the s-polarized light and the blue light L2$p$ as the p-polarized light. However, this is not a limitation, and the light source 411 can also be provided with a configuration of emitting blue light beams, which are linearly polarized light beams the same in polarization direction. In this case, it is sufficient to dispose a retardation element for changing one type of linearly polarized light having entered the retardation element to light including s-polarized light and p-polarized light between the light source section 41 and the polarization split element 44.

1.1.6. Configuration of Afocal Optical Element and Homogenizer Optical Element

The afocal optical element 42 adjusts the beam diameter of the blue light L1$s$, L2$p$ which enters the afocal optical element 42 from the light source section 41, and then makes the blue light L1$s$, L2$p$ enter the homogenizer optical element 43. The afocal optical element 42 is constituted by a lens 421 for collecting the incident light, and a lens 422 for collimating the light beam collected by the lens 421. The homogenizer optical element 43 homogenizes the illuminance distribution of the blue light L1$s$, L2$p$. The homogenizer optical element 43 is formed of a pair of multi-lens arrays 431, 432.

1.1.7. Configuration of Polarization Split Element

The blue light L1$s$, L2$p$ having passed through the homogenizer optical element 43 enters the polarization split element 44. The polarization split element 44 is a prism-type polarization beam splitter, and separates an s-polarization component and a p-polarization component included in the incident light from each other. Specifically, the polarization split element 44 reflects the s-polarization component, and transmits the p-polarization component. Further, the polarization split element 44 has a color separation characteristic of transmitting light with the wavelength no shorter than a predetermined wavelength irrespective of whether the light is the s-polarization component or the p-polarization component. Therefore, the blue light L1$s$ as the s-polarized light is reflected by the polarization split element 44, and then enters the first light collection element 45. Meanwhile, the blue light L2$p$ as the p-polarized light is transmitted through the polarization split element 44, and then enters the first retardation element 47.

1.1.8. Configuration of First Light Collection Element

The first light collection element 45 converges the blue light L1$s$ having been reflected by the polarization split element 44 on the wavelength conversion element 46. Further, the first light collection element 45 collimates fluorescence YL entering the first light collection element 45 from the wavelength conversion element 46. Although the first light collection element 45 is constituted by two lenses 451, 452 in the example shown in FIG. 3, the number of the lenses constituting the first light collection element 45 does not matter.

1.1.9. Configuration of Wavelength Conversion Element

The wavelength conversion element 46 is excited by the incident light to generate the fluorescence YL longer in wavelength than the incident light, and emits the fluorescence YL to the first light collection element 45. In other words, the wavelength conversion element 46 converts the wavelength of the incident light, and emits the light thus converted. The fluorescence YL generated by the wavelength conversion element 46 is, for example, light with the peak wavelength in a range of 500 nm through 700 nm. The wavelength conversion element 46 is provided with a wavelength converter 461 and a heat radiator 462.

Although not shown in the drawing, the wavelength converter 461 has a wavelength conversion layer and a reflecting layer. The wavelength conversion layer includes a phosphor for diffusely emitting the fluorescence YL as non-polarized light obtained by performing the wavelength conversion on the blue light L1$s$ entering the phosphor. The fluorescence YL entering the reflecting layer from the wavelength conversion layer is reflected by the reflecting layer toward the first light collection element 45. The heat radiator 462 is disposed on a surface on an opposite side to the incident side of light in the wavelength converter 461 to radiate the heat generated in the wavelength converter 461.

The fluorescence YL having been emitted from the wavelength conversion element 46 passes through the first light collection element 45 along the illumination light axis Ax2, and then enters the polarization split element 44 having the color separation characteristic described above. Then, the fluorescence YL passes through the polarization split element 44 along the illumination light axis Ax2, and then enters the second retardation element RP. It should be noted that the wavelength conversion element 46 can also be provided with a configuration of being rotated around a rotational axis parallel to the illumination light axis Ax2 by a rotation device such as a motor.

1.1.10. Configuration of First Retardation Element and Second Light Collection Element The first retardation element 47 is disposed between the polarization split element 44 and the second light collection element 48. The first retardation element 47 converts the blue light L2$p$ having passed through the polarization split element 44 into blue light L2$c$ as circularly polarized light. The blue light L2$c$ enters the second light collection element 48. The second light collection element 48 converges the blue light L2$c$ entering the second light collection element 48 from the first retardation element 47 on the diffusely reflecting device 49. Further, the second light collection element 48 collimates the blue light L2$c$ entering the second light collection element 48 from the diffusely reflecting device 49. It should be noted that the number of lenses constituting the second light collection element 48 can arbitrarily be changed.

1.1.11. Configuration of Diffusely Reflecting Device

The blue light L2$c$ having entered the diffusely reflecting device 49 is diffusely reflected by the diffusely reflecting device 49 at substantially the same diffusion angle as that of the fluorescence YL generated in and emitted from the wavelength conversion element 46. As a configuration of the diffusely reflecting device 49, there can be illustrated a configuration provided with a reflecting plate for performing Lambertian reflection on the blue light L2$c$ having entered the reflecting plate, and a rotation device for rotating the reflecting plate around a rotational axis parallel to the illumination light axis Ax1.

The blue light L2$c$ having diffusely been reflected by the diffusely reflecting device 49 passes through the second light collection element 48, and then enters the first retardation element 47. The blue light L2$c$ is converted into circularly polarized light with the opposite rotational direction when reflected by the diffusely reflecting device 49. Therefore, the blue light L2$c$ having entered the first retardation element 47 via the second light collection element 48 is not converted into the blue light L2$p$ as the p-polarized light at the moment when having entered the first retardation element 47 from the polarization split element 44, but is converted into the blue light L2$s$ as the s-polarized light. Then, the blue light L2$s$ is reflected by the polarization split element 44 to enter the second retardation element RP. Therefore, the light which enters the second retardation element RP from the polarization split element 44 is white light having the blue light L2$s$ and the fluorescence YL mixed with each other.

1.1.12. Configuration of Second Retardation Element

The white light entering the second retardation element RP from the polarization split element 44 is converted by the second retardation element RP into light having s-polarized light and p-polarized light mixed with each other. Illumination light WL as the white light converted in such a manner enters the homogenizing device 31 described above.

1.1.13. Configuration of Cooler

The cooler 5 cools the cooling target constituting the projector 1. In the present embodiment, the cooling target is the light source 411 of the light source device 4. As shown in FIG. 2, the cooler 5 is provided with a loop heat pipe 51 and a cooling fan 54.

The cooling fan 54 is disposed between the exhaust port 232 and a condenser 7 described later of the loop heat pipe 51 in the space inside the exterior housing 2. The cooling fan 54 makes cooling air flow through the condenser 7 in the process of suctioning the cooling air inside the exterior housing 2 to discharge the cooling air from the exhaust port 232, and thus, cools the condenser 7. It should be noted that it is also possible to adopt a configuration in which, for example, the cooling fan 54 is disposed between the introduction port 261 and the condenser 7 described later in the space inside the exterior housing 2, and suctions the cooling air located outside the exterior housing 2 to feed the cooling air to the condenser 7.

The loop heat pipe 51 has a circulation channel through which the working fluid circulates, wherein the working fluid is encapsulated in a reduced pressure state to thereby be changed in phase state at a relatively low temperature. In the detailed description, the loop heat pipe 51 causes the phase change of the phase state of the working fluid encapsulated inside the loop heat pipe 51 in the reduced pressure state from the liquid phase to the gas phase with the heat transferred from the cooling target to draw the heat from the working fluid in the gas phase in a region other than regions where the phase change of the working fluid from the liquid phase to the gas phase has occurred to thereby change the working fluid in phase from the gas phase to the liquid phase, and at the same time, radiates the heat thus drawn to thereby cool the cooling target. It should be noted that water can be cited as an example of the working fluid. Such a loop heat pipe 51 is provided with the evaporator 6, a vapor pipe 52, the condenser 7, and a liquid pipe 53. It should be noted that a configuration of the evaporator 6 will be described later in detail.

1.1.14. Configuration of Vapor Pipe and Liquid Pipe

The vapor pipe 52 is a tubular member for coupling the evaporator 6 and the condenser 7 to each other in the circulation channel of the working fluid so that the working fluid in the gas phase can flow. The vapor pipe 52 makes the working fluid in the gas phase having changed to one in the gas phase in the evaporator 6 and then flowing from the evaporator 6 into the vapor pipe 52 flow into the condenser 7.

The liquid pipe 53 is a tubular member for coupling the condenser 7 and the evaporator 6 to each other in the circulation channel of the working fluid so that the working fluid in the liquid phase can flow. The liquid pipe 53 makes the working fluid having changed from one in the gas phase to one in the liquid phase in the condenser 7 flow into the evaporator 6.

1.1.15. Configuration of Condenser

The condenser 7 changes the working fluid in phase from the gas phase to the liquid phase, and makes the working fluid in the liquid phase outflow to the liquid pipe 53. In other words, the condenser 7 condenses the working fluid in the gas phase to change the working fluid in the gas phase to the working fluid in the liquid phase. Although not shown in the drawings, the condenser 7 has a main body part to which the vapor pipe 52 and the liquid pipe 53 are coupled, and a heat radiator coupled to the main body part. The main body part has a flow channel inside the main body part, wherein the working fluid in the gas phase inflowing from the vapor pipe 52 flows through the flow channel, and the flow channel is communicated with the liquid pipe 53. The heat of the working fluid in the gas phase is received by the main body part and thus the working fluid is cooled in the process in which the working fluid in the gas phase flows through the flow channel inside the main body part, and thus, the working fluid in the gas phase is changed to the working fluid in the liquid phase. Then, the working fluid having been changed in phase to the liquid phase further flows through the flow channel to be cooled by the main body part receiving the heat of the working fluid in the liquid phase, and then flows out to the liquid pipe 53.

The heat radiator is a member for radiating the heat of the working fluid having been transferred to the main body part, and is a so-called heatsink. Through the heat radiator, the cooling gas in the exterior housing 2 flows due to the drive of the cooling fan 54, and thus, the condenser 7 is cooled.

1.2. Configuration of Evaporator

The details of the evaporator 6 provided to the cooler 5 according to the present embodiment will hereinafter be described. The evaporator 6 evaporates the working fluid in the liquid phase with the heat transferred from the light source 411 as the cooling target via the support member 414 to change the working fluid in the liquid phase to the working fluid in the gas phase.

1.2.1. External Configuration of Evaporator

Figure 4:
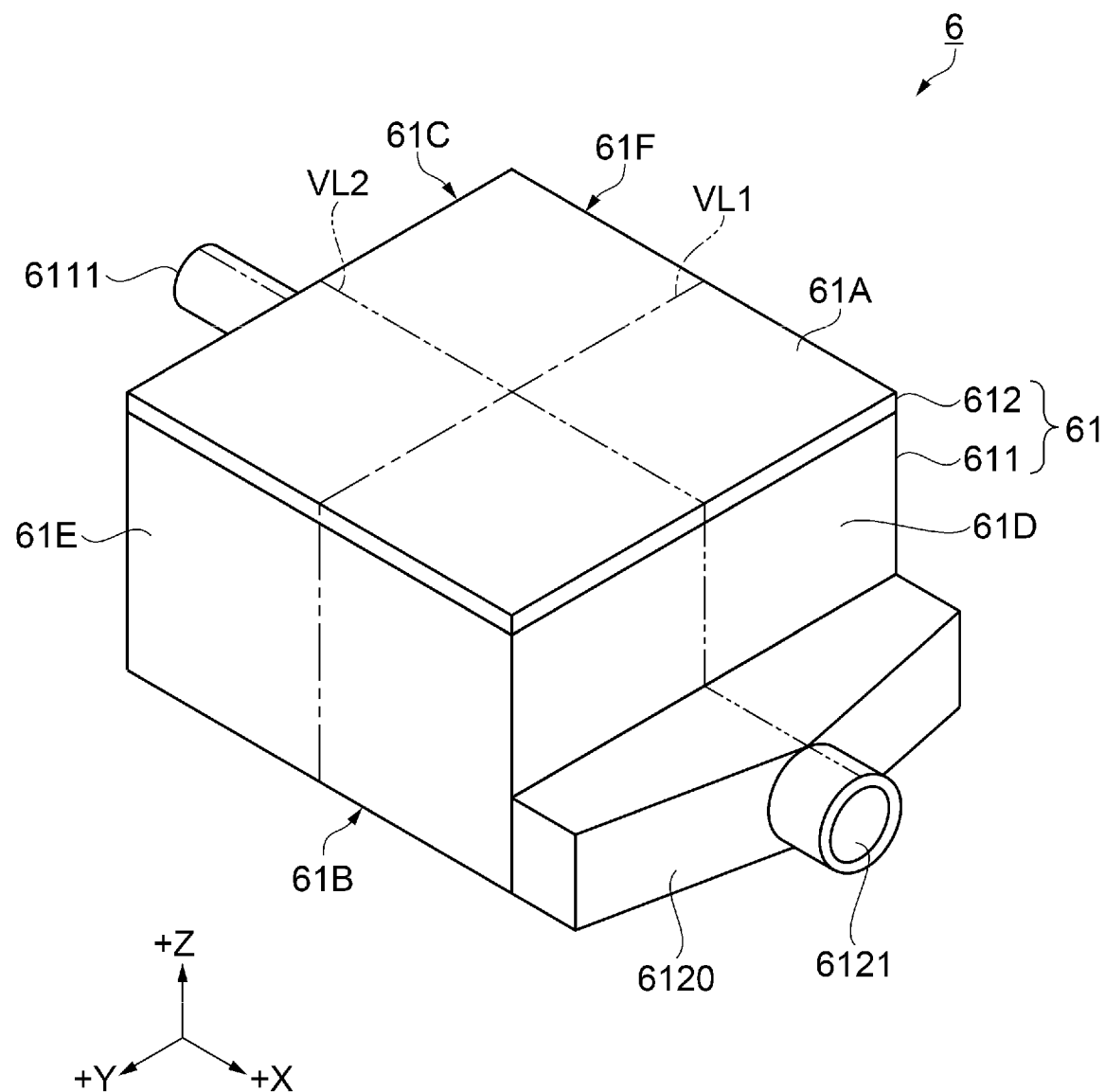
FIG. 4 is a perspective view showing an appearance of an evaporator.

FIG. 4 is a perspective view showing an appearance of the evaporator 6. It should be noted that in each of the following drawings, there are attached X, Y, and Z axes as coordinate axes perpendicular to each other. In that case, in the X, Y, and Z axes in each of the drawings, the X-Y plane is made substantially coincide with a horizontal plane. It should be noted that the +Z direction is referred to as an upper side, and the −Z direction is referred to as a lower side. In the present embodiment, the +Z direction is a direction from a groove member 64 described later toward a wick 63 described later. Further, the +X direction is a direction in which the working fluid in the gas phase is discharged from a housing 61. In other words, the +X direction is a direction in which a plurality of vapor flow channels 651 described later extend. Further, the +Y direction is a direction which is perpendicular to the +X direction, and in which a plurality of plate-like members 640 described later are arranged.

As shown in FIG. 4, the evaporator 6 is provided with the housing 61 having a case part 611 and a lid part 612. The housing 61 has a ceiling surface 61A, a bottom surface part 61B, a back surface part 61C, a front surface part 61D, a left side surface part 61E, and a right side surface part 61F, and is formed to have a substantially rectangular solid shape. Among the surfaces constituting the housing 61, the ceiling surface 61A is included in the lid part 612, and the other surfaces are included in the case part 611. The case part 611 and the lid part 612 are each formed of a member made of metal having thermal conductivity.

The lid part 612 is a plate-like member having a substantially square shape. In order to provide a sealed space inside the housing 61, the case part 611 and the lid part 612 are bonded to each other to be sealed by, for example, brazing. The size of the lid part 612 is not particularly limited, but is about 30 mm on a side in a plan view viewed from, for example, a +Z direction.

The case part 611 has an inflow part 6111 in the back surface part 61C. The inflow part 6111 is disposed in a substantially central part in the ±Y direction and near to the end part on the upper side in the back surface part 61C. The inflow part 6111 has a cylindrical shape, and is communicated with the inner side of the case part 611. To the inflow part 6111, there is coupled the liquid pipe 53 shown in FIG. 2. Thus, the working fluid changed in phase to the liquid phase in the condenser 7 inflows into the housing 61 through the inflow part 6111.

To the front surface part 61D, there is attached a discharge section 6120. The discharge section 6120 is located in an end part on the lower side of the front surface part 61D, and forms a funnel shape narrowed toward the +X direction side. At the tip in the +X direction of the discharge section 6120, there is disposed a coupling section 6121 having a cylindrical shape. The coupling section 6121 is communicated with the inner side of the case part 611 via the discharge section 6120. The coupling section 6121 is coupled to the vapor pipe 52 shown in FIG. 2. Thus, the working fluid having changed in phase from the liquid phase to the gas phase in the evaporator 6 is discharged to the vapor pipe 52 through the coupling section 6121.

The discharge section 6120 is formed of, for example, a member made of metal. In order to provide a closed space inside the housing 61, the case part 611 and the discharge section 6120 are bonded to each other to be sealed by, for example, brazing.

The bottom surface part 61B is a heat receiver to which the heat is transferred from the cooling target. To the bottom surface part 61B as the heat receiver, there is coupled the support member 414 of the light source 411 shown in FIG. 3.

1.2.2. Internal Configuration of Evaporator

Figure 5:
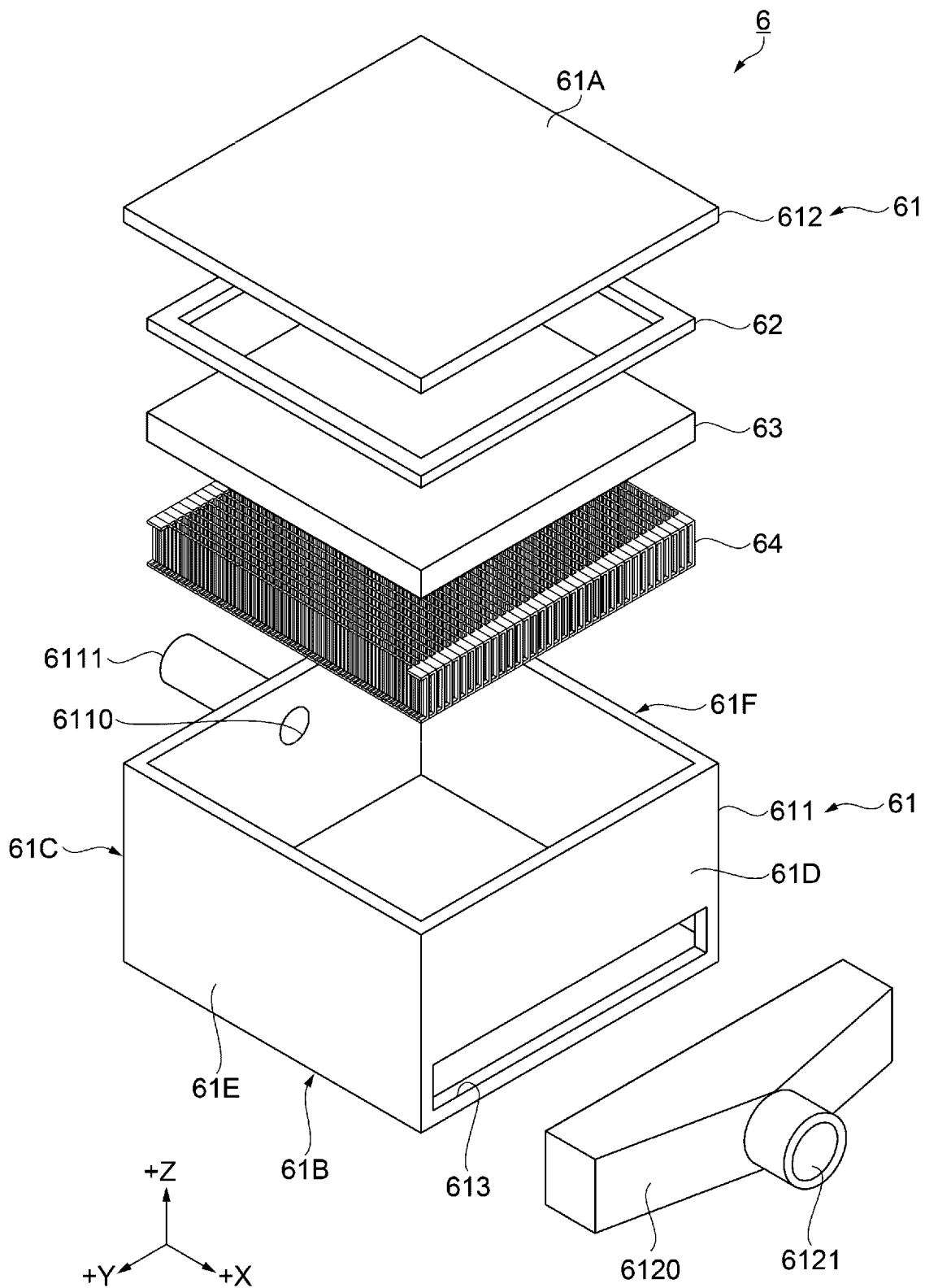
FIG. 5 is an exploded perspective view showing an internal configuration of the evaporator.

FIG. 5 is an exploded perspective view showing an internal configuration of the evaporator 6. As shown in FIG. 5, the evaporator 6 has a partition wall 62, the wick 63, and the groove member 64 inside the housing 61. These constituents are arranged in the internal space of the housing 61 so as to be stacked in the order of the groove member 64, the wick 63, and the partition wall 62 upward from the bottom surface part 61B side. The groove member 64 and the wick 63 are each generally shaped like a substantially flat plate, and each have a rectangular shape in a plan view viewed from the +Z direction. The partition wall 62 is a frame body having a rectangular shape in the plan view viewed from the +Z direction. The details of the partition wall 62, the wick 63, and the groove member 64 will be described later.

In the back surface part 61C, an inflow side opening part 6110 corresponding to the inflow part 6111 is disposed on the inner side of the housing 61. The inflow side opening part 6110 is a substantially circular opening, and is communicated with the inflow part 6111. Thus, there is ensured the communication between the inside of the housing 61, namely the inside of the evaporator 6, and the liquid pipe 53 to which the inflow part 6111 is coupled.

In the front part 61D, there is disposed a discharge side opening part 613 at a position corresponding to the discharge section 6120. The discharge side opening part 613 is an opening having a substantially rectangular shape elongated in the ±Y directions, and communicates the inside of the housing 61 and the inside of the discharge section 6120 with each other. The discharge side opening part 613 is disposed so as to be shifted to a side on the lower side of the front surface part 61D. The long side of the discharge side opening part 613 extends along the ±Y directions, and is formed to be slightly smaller in length than the side on the lower side of the front surface part 61D. The short side of the discharge side opening part 613 extends along the ±Z directions, and is formed to be slightly smaller in length in the ±Z directions than the discharge section 6120. Due to the discharge side opening part 613, there is ensured the communication between the inside of the evaporator 6 and the vapor pipe 52 to which the coupling section 6121 is coupled.

Figure 6:
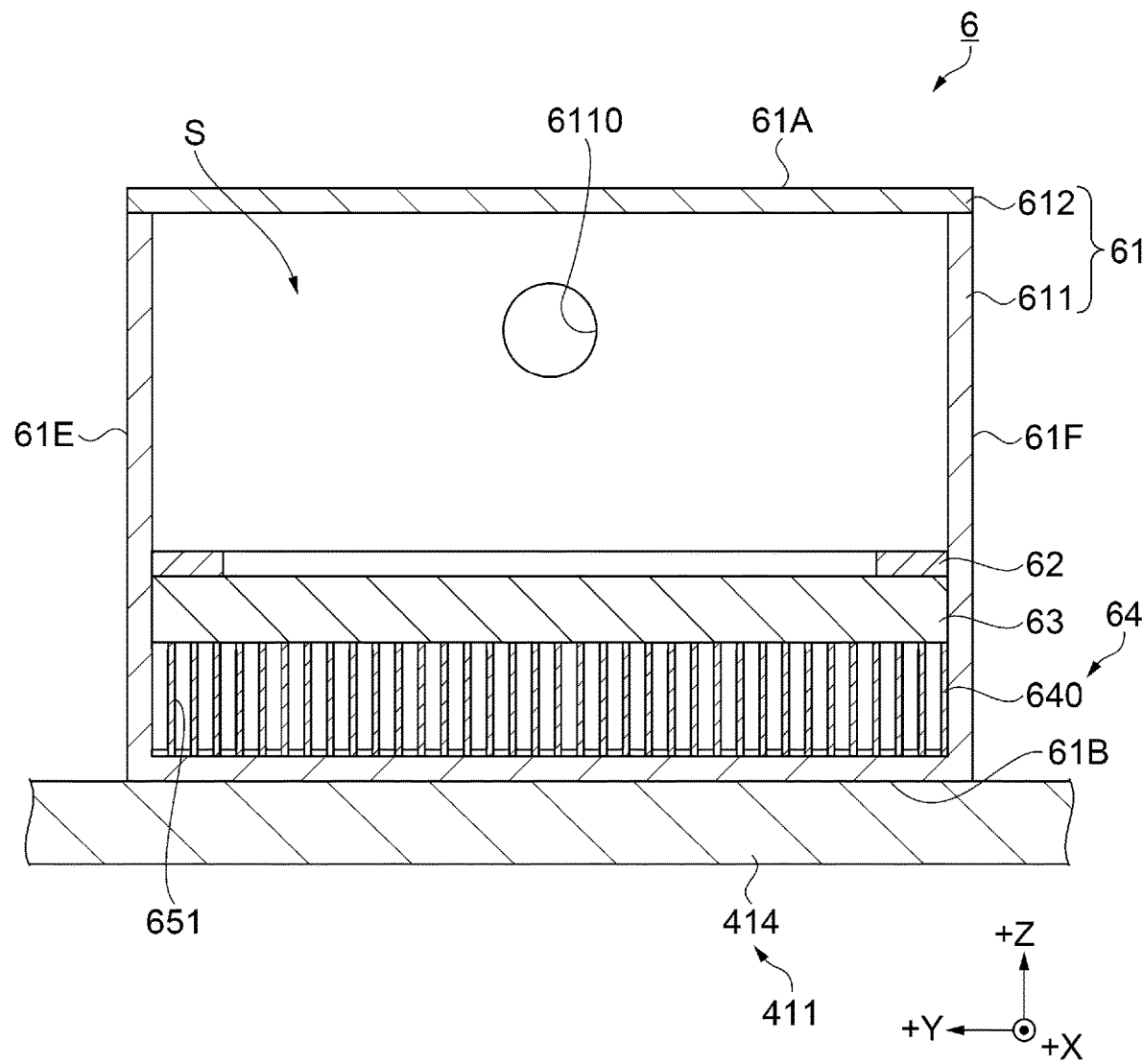
FIG. 6 is a cross-sectional view showing an internal structure of the evaporator.

FIG. 6 is a cross-sectional view showing an internal structure of the evaporator 6. Here, FIG. 6 shows a cross-section of the evaporator 6 viewed from the +X direction with respect to a dividing plane VL1 shown in FIG. 4. The evaporator 6 is an evaporator for evaporating the working fluid in the liquid phase with the heat transferred from the light source 411 via the support member 414 to change the working fluid in the liquid phase to the working fluid in the gas phase.

As shown in FIG. 6, the bottom surface part 61B of the evaporator 6 is coupled to the support member 414 of the light source 411. In other words, the evaporator 6 is coupled to the support member 414 of the light source 411 on the bottom surface part 61B. Thus, the heat of the semiconductor lasers 412, 413 shown in FIG. 4 is transferred to the bottom surface part 61B of the evaporator 6 via the support member 414. It should be noted that the bottom surface part 61B and the support member 414 can also be coupled to each other via a heat receiving member. As the heat receiving member, there can be cited a thermally-conductive member such as a heat-transfer grease.

Inside the housing 61 of the evaporator 6, there is disposed the groove member 64, the wick 63, and the partition wall 62. The groove member 64, the wick 63, and the partition wall 62 each have a shape along the inner wall surface of the housing 61.

The housing 61 has a space S inside. The space S is formed by arranging the groove member 64, the wick 63, and the partition wall 62 inside the housing 61, and retains the working fluid in the liquid phase inflowing into the housing 61 via the inflow part 6111 coupled to the liquid pipe 53.

The partition wall 62 is disposed so as to press the wick 63 downward from the above. The wick 63 is mounted on the upper side of the groove member 64, and then the partition wall 62 is fixed to, for example, the housing 61 by brazing. Due to the partition wall 62, contact between the bottom surface inside the housing 61 and the groove member 64, and contact between the groove member 64 and the wick 63 are ensured. The partition wall 62 is formed of, for example, a member made of metal.

The wick 63 is soaked with the working fluid in the liquid phase retained in the space S from the above, and transports the working fluid in the liquid phase to the groove member 64 on the lower side. On the upper surface of the wick 63, the area where the partition wall 62 does not have contact with the wick 63 is exposed to the space S, and the wick 63 takes the working fluid in the liquid phase inside from the area thus exposed. The thickness in the ±Z directions of the wick 63 is not particularly limited, but is, for example, 2 mm. As the wick 63, there is adopted a porous body having a plurality of holes or a molded body of fibers. The hole diameter of the holes is, for example, no smaller than 0.1 μm and no larger than 50 μm. As the constituent material of the porous body, it is possible to adopt metal such as stainless steel or copper, or an inorganic material such as glass or ceramics. As the constituent material of the fiber, it is possible to adopt metal such as stainless steel or copper, or an inorganic material such as glass. As the molded body, there can be cited unwoven cloth formed by performing compression molding on the fibers, and what is obtained by interweaving the fibers to have a mesh-like shape.

As shown in FIG. 6, the groove member 64 is disposed below the wick 63, and is coupled to the wick 63. The groove member 64 is disposed so as to have contact with the bottom surface inside the housing 61 as the surface inside the housing 61 of the bottom surface part 61B. Thus, the groove member 64 is coupled to the support member 414 via the housing 61. The groove member 64 and the housing 61 are assembled by, for example, brazing.

Further, the groove member 64 has the plurality of vapor flow channels 651 through which the working fluid having changed in phase from the liquid phase to the gas phase flows. The plurality of vapor flow channels 651 extend along the +X direction and is arranged along the +Y direction. The plurality of vapor flow channels 651 are communicated with the coupling section 6121 of the discharge section 6120 via the discharge side opening part 613. The working fluid in the gas phase having flowed through the plurality of vapor flow channels 651 inflows into the vapor pipe 52 via the coupling section 6121.

Figure 7:
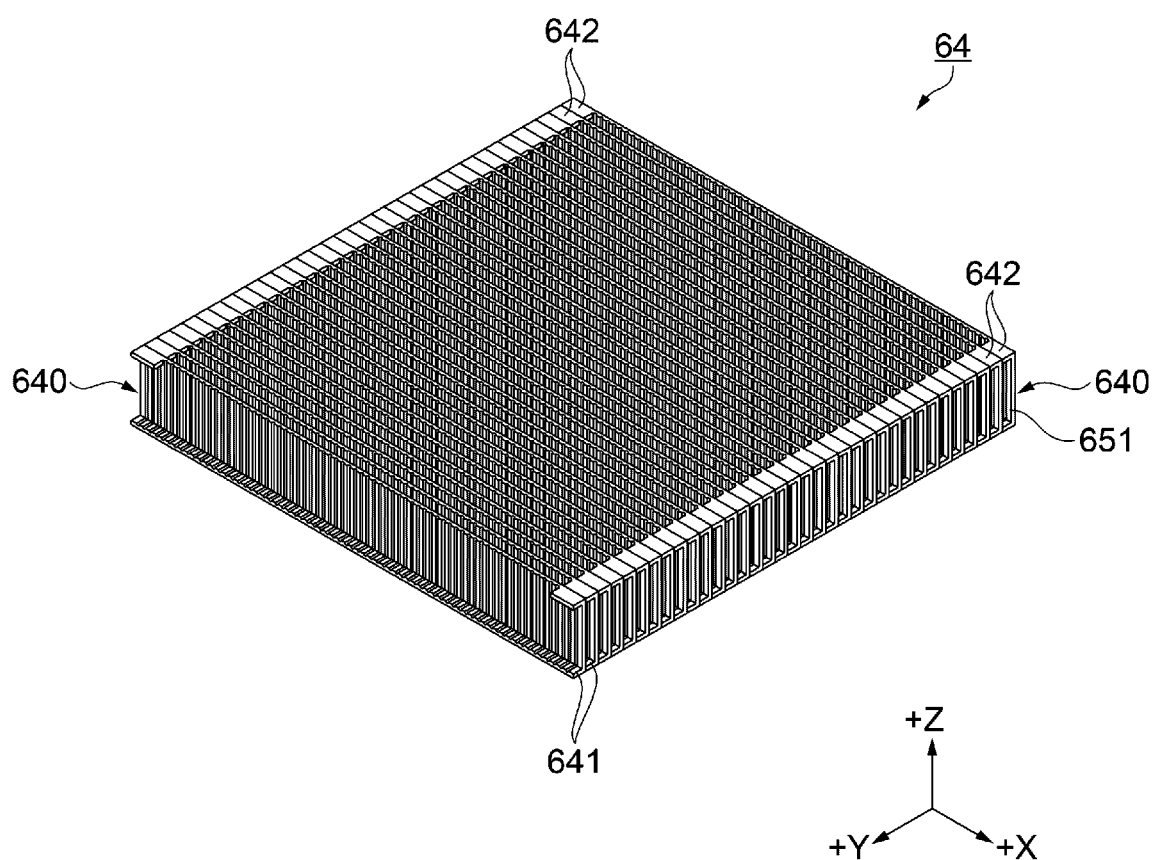
FIG. 7 is a perspective view showing an appearance of a groove member.
Figure 8:
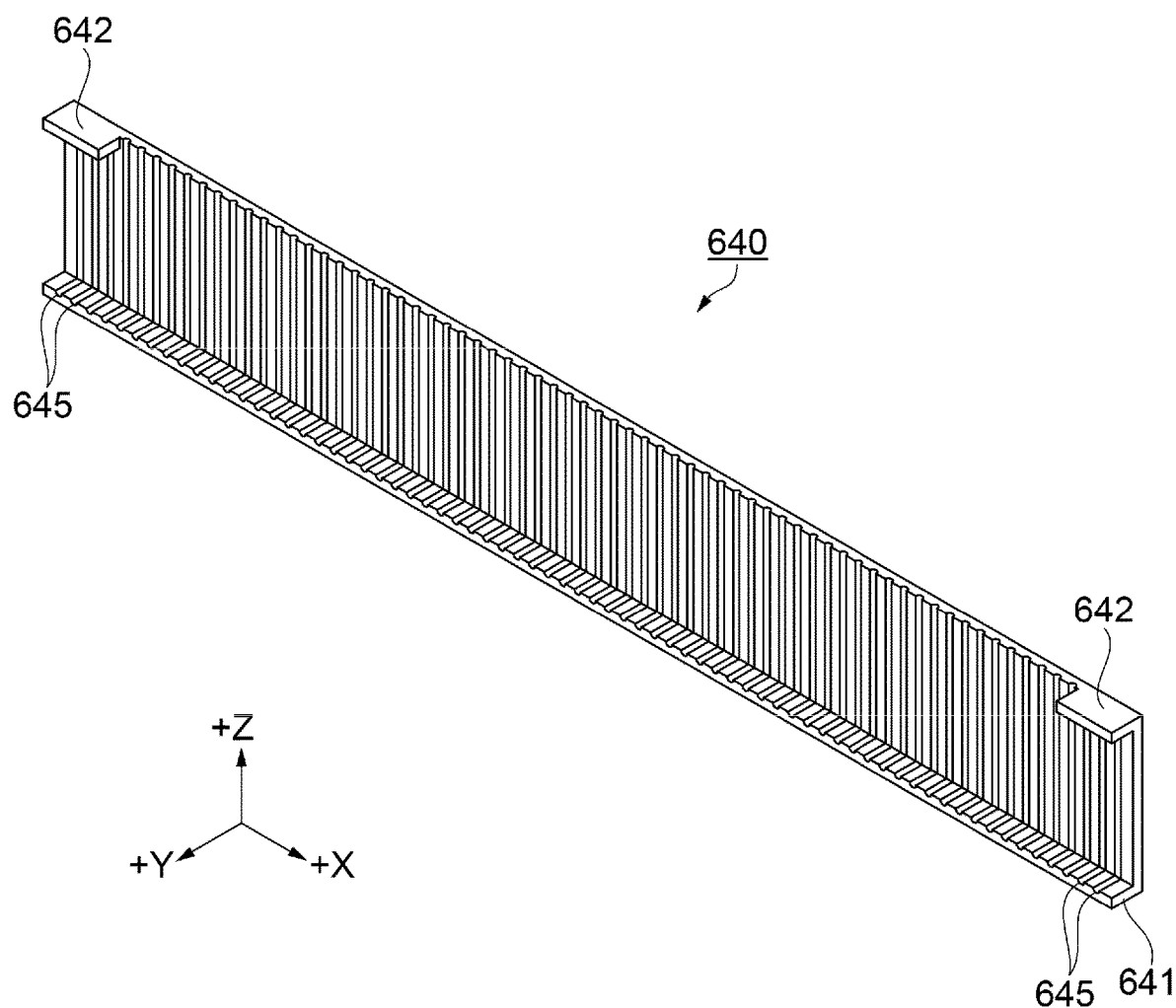
FIG. 8 is a perspective view showing an appearance of a plate like member.

Here, the detailed configuration of the groove member 64 will be described with reference to FIG. 7 and FIG. 8. FIG. 7 is a perspective view showing an appearance of the groove member 64. FIG. 8 is a perspective view showing an appearance of the plate-like member 640.

As shown in FIG. 7 and FIG. 8, the groove member 64 includes the plurality of plate-like members 640 arranged side by side along the ±Y directions as predetermined directions. The plurality of plate-like members 640 constitute the plurality of vapor flow channels 651. In details, the plate-like members 640 are arranged so as to be stacked in the ±Y direction setting the thickness direction of the plate-like members 640 to the ±Y direction. The plurality of plate-like members 640 are formed on metal, and are specifically formed of copper having the thickness of about 0.1 mm. The plate-like members 640 each have a rectangular shape having a pair of long sides along the ±X directions and a pair of short sides along the ±Z directions.

Here, in the present embodiment, the thermal conductivity of the plurality of plate-like members 640 is higher than the thermal conductivity of the wick 63. Thus, the heat from the support member 414 of the light source 411 via the bottom surface part 61B of the housing 61 is efficiently transferred to the groove member 64, and at the same time, the heat becomes difficult to be transferred from the plate-like members 640 to the wick 63.

Further, each of the plate-like members 640 has a bent part 641, connecting parts 642, and evaporation promoters 645.

The bent part 641 is disposed in the lower long side as one of the long sides in the plate-like member 640. The bent part 641 is a shape of the lower long side as a part of the plate-like member 640 bent at an angle of about 90 degrees. In detail, the bent part 641 projects toward the +Y direction from the plate-like member 640 along the ±Z direction in the plan view viewed from the +X direction. Thus, when the groove member 64 is housed inside the housing 61 of the evaporator 6, a region on the −Z direction side of the bent part 641 is coupled to the bottom surface inside the housing 61. In other words, the bent part 641 is coupled to the bottom surface part 61B as the heat receiver.

The connecting parts 642 are respectively disposed on both end parts of the upper long side as the other of the long sides in the plate-like member 640 to form a pair. Each of the connecting parts 642 has a shape obtained by bending the upper long side of the plate-like member 640 at an angle of about 90 degrees. In detail, the connecting parts 642 each project toward the +Y direction from the plate-like member 640 along the ±Z direction in the plan view viewed from the +X direction. The connecting parts 642 formed by bending the upper long side as the other of the long sides in the plate-like member 640 of the groove member 64 is coupled to the wick 63.

The bent part 641 and the connecting parts 642 are formed by, for example, press working. The projection amount of the bent part 641 and the connecting parts 642 projecting toward the +Y direction is not particularly limited, but is, for example, about 0.3 mm. Further, the length in the ±Z directions of the plate-like member 640, namely the length of the short side of the plate-like member 640, is not particularly limited, but is, for example, about 2 mm.

The groove member 64 is constituted by the bent part 641 of one of the plate-like members 640 and another of the plate-like members 640 adjacent to the one of the plate-like members 640 coupled to each other. On this occasion, the connecting parts 642 of the one of the plate-like members 640 and the another of the plate-like members 640 adjacent to the one of the plate-like members 642 are also coupled to each other. As a method of coupling the plate-like members 640 adjacent to each other, there can be adopted swage working using the connecting parts 642 and so on.

When the plurality of plate-like members 640 are coupled to each other in such a manner, the distance at which the plurality of plate-like members 640 adjacent to each other are arranged side by side along the ±Y directions as the predetermined directions becomes substantially equal to the amount of the projection toward the +Y direction of the bent part 641. Here, the distance at which the plurality of plate-like members 640 are arranged side by side along the ±Y directions is hereinafter simply referred to as a distance between the plate-like members 640 adjacent to each other. It should be noted that the pitch at which the plurality of plate-like members 640 are arranged side by side along the ±Y directions becomes a value obtained by adding the thickness along the ±Y directions of one plate-like member 640 to the distance between the plate-like members 640 adjacent to each other, and decreasing the distance described above has the same meaning as decreasing the pitch described above.

When the groove member 64 is assembled, there is formed a plurality of gaps in the ±Y directions between the plate-like members 640 adjacent to each other except the bent part 641 and the connecting parts 642. The gap corresponds to the vapor flow channel 651, and the plurality of plate-like members 640 form the plurality of vapor flow channels 651. The same number of vapor flow channels 651 as the number of the plate-like members 640 are formed. The plurality of vapor flow channels 651 are communicated in the ±X directions in the groove member 64. Therefore, in the vapor flow channels 651, the working fluid having changed in phase from the liquid phase to the gas phase can flow in the ±X directions, and flows in the +X direction in the present embodiment. Further, since the connecting parts 642 are disposed only in the both end parts of the upper long side of the plate-like member 640, in the upper side of the vapor flow channels 651, most area except the connecting parts 642 is communicated with the wick 63 disposed above the area.

The length of the short side described above of the plate-like member 640 is larger than the distance between the plate-like members 640 adjacent to each other. Therefore, the vapor flow channels 651 each have a substantially rectangular shape elongated in the ±Z directions in the plan view viewed from the +X direction. It is difficult to form the fine vapor flow channels 651 having such a shape by cut working from a solid material, molding, or the like. In contrast, in the present embodiment, since the plurality of plate-like members 640 are assembled to form the groove member 64, it is possible to more easily form the fine vapor flow channels 651 than ever before.

In the plate-like member 640, there are disposed the evaporation promoters 645 for increasing the contact area between the working fluid in the liquid phase and the groove member 64. As shown in FIG. 8, the evaporation promoter 645 has a groove having a substantially semicircular cross-sectional shape provided to the plate-like member 640. The plurality of evaporation promoters 645 are grooves along the short side of the plate-like member 640, and are arranged side by side in the ±X directions. The number and the configuration of the grooves in the evaporation promoters 645 are not limited to the above. Due to the evaporation promoters 645, the surface area of the plate-like member 640 facing the vapor flow channel 651 increases. Further, due to the capillary force of the grooves in the evaporation promoters 645, the working fluid in the liquid phase spreads to wet the inside of the grooves. Therefore, the contact area between the working fluid in the liquid phase and the groove member 64 increases.

Here, although not shown in the drawings, it is also possible to dispose the evaporation promoters 645 also in a region on the −Y direction side of the plate-like member 640. Further, although in the present embodiment, the evaporation promoters 645 are disposed in all of the plate-like members 640 constituting the groove member 64, this is not a limitation. The evaporation promoters 645 can be provided to at least one of the plurality of plate-like members 640.

It should be noted that although in the present embodiment, there are illustrated the evaporation promoters 645 each shaped like a groove provided to the plate-like member 640, this is not a limitation. It is sufficient for the evaporation promoters 645 to be able to increase the contact area of the groove member 64 with the working fluid in the liquid phase. Specifically, it is possible to adopt a configuration of attaching a mesh-like member to the plate-like member 640, a configuration of sintering metal powder into the plate-like member 640, and so on.

Figure 9:
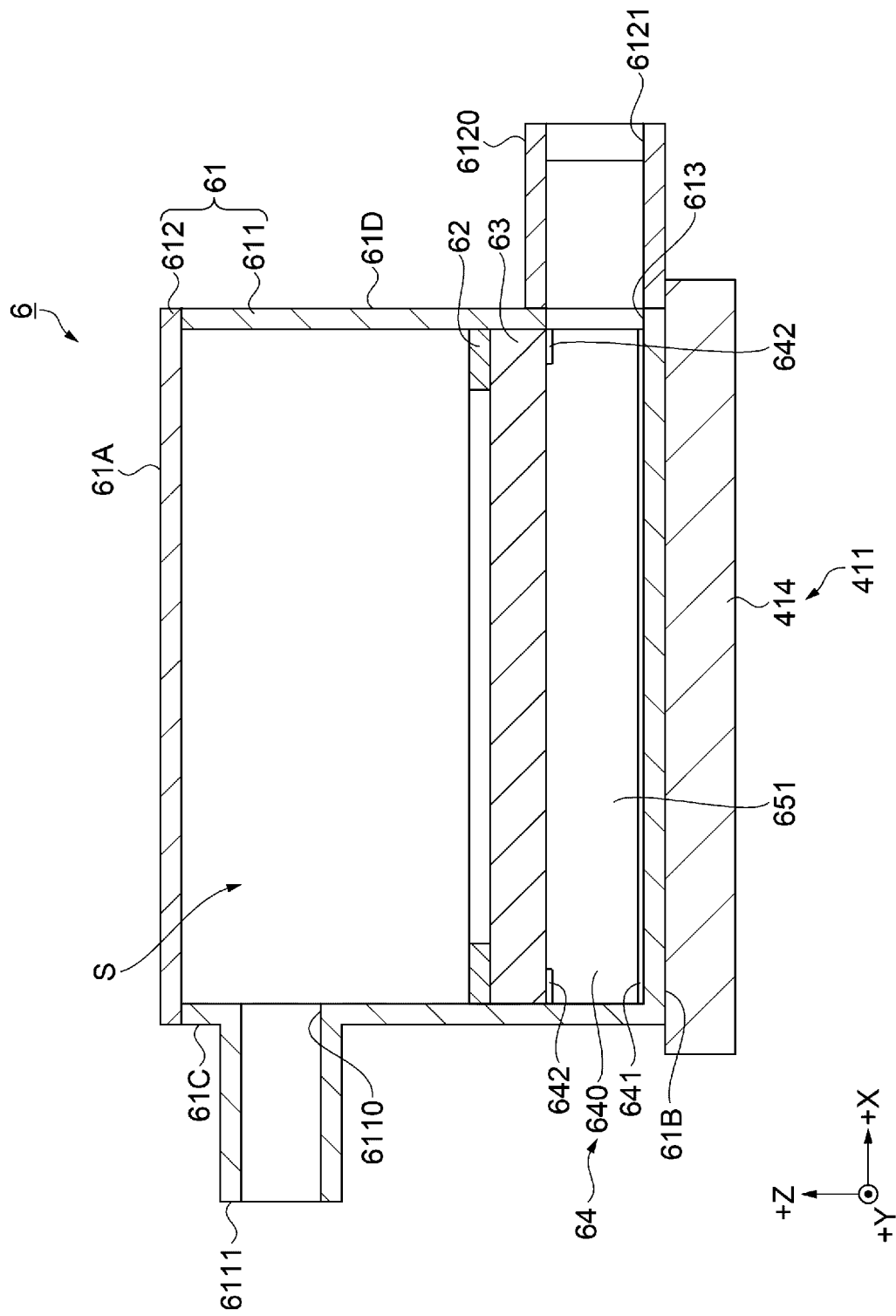
FIG. 9 is a cross-sectional view showing an internal structure of the evaporator.

Then, the function of the evaporator 6 will be described with reference to FIG. 9. FIG. 9 is a cross-sectional view showing an internal structure of the evaporator 6. Here, FIG. 9 shows a cross-section of the evaporator 6 viewed from the +Y direction with respect to a dividing plane VL2 shown in FIG. 4. It should be noted that in the groove member 64 shown in FIG. 9, illustration of the evaporation promoters 645 is omitted.

As shown in FIG. 9, the bottom surface part 61B of the housing 61 of the evaporator 6 is coupled to the support member 414 of the light source 411. Although not shown in the drawing, the inflow part 6111 is coupled to the liquid pipe 53, and the coupling section 6121 of the discharge section 6120 is coupled to the vapor pipe 52. Inside the housing 61, there is disposed the groove member 64 so as to have contact with the bottom surface of the housing 61, and there is disposed the wick 63 and the partition wall 62 above the groove member 64. Further, the space S is formed above the wick 63 and the partition wall 62. The space S is a reservoir in the evaporator 6, and retains the working fluid in the liquid phase having flowed therein from the liquid pipe 53.

The working fluid in the liquid phase outflows from the condenser 7 shown in FIG. 2 to the liquid pipe 53, and then inflows into the space S inside the housing 61 through the inflow side opening part 6110. A part of the working fluid in the liquid phase having flowed into the housing 61 is taken and soaks into the wick 63, and the rest thereof remains in the space S described above and is retained therein.

A capillary action works on the working fluid in the liquid phase having soaked into the wick 63 due to the plurality of holes provided to the wick 63. Therefore, the working fluid in the liquid phase is transferred substantially from the upper side toward the lower side in the wick 63, and then seeps out toward the groove member 64. Subsequently, the working fluid in the liquid phase having seeped toward the groove member 64 spreads to wet the surface of the plate-like member 640, in other words, an area facing the vapor flow channel 651 of the plate-like member 640. On this occasion, since the plate-like member 640 is provided with the evaporation promoters 645, the working fluid in the liquid phase also spreads to wet the inside of the groove of each of the evaporation promoters 645. Thus, the contact area between the working fluid in the liquid phase and the groove member 64 increases.

In contrast, the heat of the light source 411 is transferred from the support member 414 to the groove member 64 mainly via the bottom surface part 61B of the housing 61. In the groove member 64, the bent part 641 has contact with the bottom surface inside the housing 61. Therefore, the heat from the light source 411 propagates generally upward from the bent part 641 via the main body of the plate-like member 640.

In the groove member 64, the working fluid in the liquid phase having spread to wet the groove member 64 from above is heated by the heat having propagated from below. Inside the loop heat pipe 51, there is encapsulated the working fluid in a reduced pressure state. Therefore, the working fluid evaporates at a lower boiling temperature compared to that at the atmospheric pressure. The working fluid evaporates with the heat from the light source 411 to change in phase to the gas phase. On this occasion, the heat of the plate-like member 640 is absorbed due to the vaporization heat of the working fluid. The working fluid in the gas phase is generated inside the vapor flow channel 651, and then migrates toward the discharge section 6120. It should be noted that in the evaporator 6 in the present embodiment, since the thermal conductivity of the plate-like member 640 is higher than the thermal conductivity of the wick 63, it is difficult for the evaporation of the working fluid to occur inside the wick 63 due to the heat propagated from the groove member 64.

The working fluid in the gas phase is discharged to the vapor pipe 52 from the discharge side opening part 613 via the coupling section 6121 of the discharge section 6120. The working fluid in the gas phase flows into the condenser 7 shown in FIG. 2 via the vapor pipe 52, and is then condensed into the working fluid in the liquid phase as described above to be made to return to the evaporator 6. As described above, in the loop heat pipe 51, there is formed a reflux system for continuously developing the evaporation and the condensation of the working fluid.

Due to the vaporization heat caused when the working fluid in the liquid phase changes to the working fluid in the gas phase, the heat of the plate-like member 640 is absorbed, and thus, the plate-like member 640 is cooled. Thus, the heat of the support member 414 is also absorbed via the housing 61, and thus, the support member 414 is also cooled. In other words, due to the vaporization heat of the working fluid, the semiconductor lasers 412, 413 are cooled. It should be noted that when the loop heat pipe 51 is at work, the action of the loop heat pipe 51 described above continuously progresses.

It should be noted that although in the present embodiment, there is illustrated the configuration in which the cooling target is the light source 411 of the projector 1, the cooling target is not limited to the semiconductor lasers, but can also be a light source lamp such as a super high-pressure mercury lamp, or other solid-state light sources such as an LED (Light Emitting Diode). Further, the light modulator to which the cooler according to the present disclosure is applied is not limited to the transmissive liquid crystal panel, but can also be a reflective liquid crystal panel, a DMD (Digital Micromirror Device), or the like. Further, it is also possible for the cooler according to the present disclosure to be applied to electronic equipment other than the projector, an illumination device equipped with a solid-state light source, and so on.

As described hereinabove, according to the loop heat pipe 51 as the cooler and the projector 1 related to the first embodiment, the following advantages can be obtained.

In the loop heat pipe 51, it is possible to achieve both of the decrease in thermal resistance and the increase in amount of heat which can be cooled. In detail, the groove member 64 is constituted by the plurality of plate-like members 640. Therefore, it becomes easy to form the vapor flow channel 651 large in depth which is difficult to form by cut working. Further, since the plurality of plate-like members 640 are arranged side by side in the ±Y directions, it becomes possible to make the depth of the vapor flow channel 651 large, and at the same time to make the distance between the plate-like members 640 adjacent to each other small. Thus, since the surface area of the plate-like member 640 increases, and the evaporation area of the working fluid increases, it is possible to increase the amount of heat which can be cooled. Further, by making the depth of the vapor flow channel 651 relatively large, it is possible to make the cross-sectional area of the vapor flow channel 651 relatively large. Therefore, it is possible to reduce the pressure loss when the working fluid in the gas phase flows through the vapor flow channel 651, and by extension, it is possible to suppress the increase in evaporation temperature of the working fluid in the liquid phase to decrease the thermal resistance of the loop heat pipe 51. Therefore, it is possible to improve the cooling performance compared to the related art.

Further, since the bent part 641 of each of the plate-like members 640 is coupled to the bottom surface part 61B as the heat receiver, the contact area between the groove member 64 and the bottom surface part 61B increases. Therefore, it becomes easy for the heat of the bottom surface part 61B to propagate to the groove member 64, and thus, the thermal resistance between the bottom surface part 61B and the groove member 64 is reduced.

Since the thermal conductivity of the plurality of plate-like members 640 is higher than the thermal conductivity of the wick 63, it becomes difficult to transfer heat to the wick 63 compared to the plate-like members 640. Therefore, it becomes difficult to transfer heat to the working fluid in the liquid phase retained in the space S via the wick 63. Thus, it is possible to suppress the rise in temperature of the working fluid in the liquid phase to prevent occurrence of heat leak.

The working fluid in the liquid phase becomes difficult to evaporate inside the wick 63, and becomes to evaporate mainly in the groove member 64 constituted by the plurality of plate-like members 640. In other words, since the contact area between the working fluid in the liquid phase and the groove member 64 constituted by the plurality of plate-like members 640 increases to thereby increase the evaporation area, and thus it is possible to increase the amount of heat which can be cooled in the loop heat pipe 51, it is possible to further improve the cooling performance of the loop heat pipe 51.

Further, since the working fluid in the liquid phase is difficult to evaporate inside the wick 63, the working fluid in the gas phase migrating inside the wick 63 decreases. In other words, since the working fluid in the gas phase migrates mainly through the vapor flow channel 651 formed of the groove member 64 as a result, the pressure loss of the working fluid in the gas phase, namely the pressure loss of the vapor, is reduced. Thus, it becomes possible for the working fluid in the liquid phase to evaporate at relatively low temperature, and the cooling performance is further improved.

Since the length of the short side along the ±Z directions of the plate-like member 640 is larger than the distance between the plate-like members 640 adjacent to each other, the depth of the vapor flow channel 651 becomes deeper. Thus, the contact area between the working fluid in the liquid phase and the groove member 64 is further increased to increase the evaporation area of the working fluid, and thus, the loop heat pipe 51 is further improved.

Since the plate-like members 640 adjacent to each other are coupled to each other via the bent part 641, it becomes easy to propagate the heat also between the plurality of plate-like members 640, and thus, the cooling performance is further improved.

In the evaporation promoters 645, it becomes easy for the working fluid in the liquid phase to widely spread to wet the evaporation promoters 645 to form a film, and thus, the evaporation area of the working fluid further increases. As a result, since the amount of heat which can be cooled further increases, it is possible to further improve the cooling performance of the loop heat pipe 51.

Due to the grooves of the evaporation promoters 645, the surface area of the plate-like member 640 increases, and thus, it is possible to increase the contact area between the groove member 64 and the working fluid in the liquid phase.

It is possible for the loop heat pipe 51 to efficiently cool each of the devices provided to the projector 1. Further, the loop heat pipe 51 is improved in cooling performance, and therefore becomes easy to be reduced in size. Further, since the cooling target is the light source 411, it is possible to efficiently cool the light source 411.

2. Second Embodiment

In the present embodiment, a loop heat pipe as a cooler will be described with reference to the drawings. The loop heat pipe according to the present embodiment is made different in the configuration of the evaporation promoters from the loop heat pipe 51 according to the first embodiment. Therefore, the same constituents as in the first embodiment are denoted by the same reference symbols, and the duplicated descriptions will be omitted.

2.1. Configuration of Evaporation Promoter

In the loop heat pipe according to the present embodiment, the evaporation promoter for increasing the contact area between the working fluid in the liquid phase and the groove member is provided to at least one of the two or more plate-like members.

Figure 10:
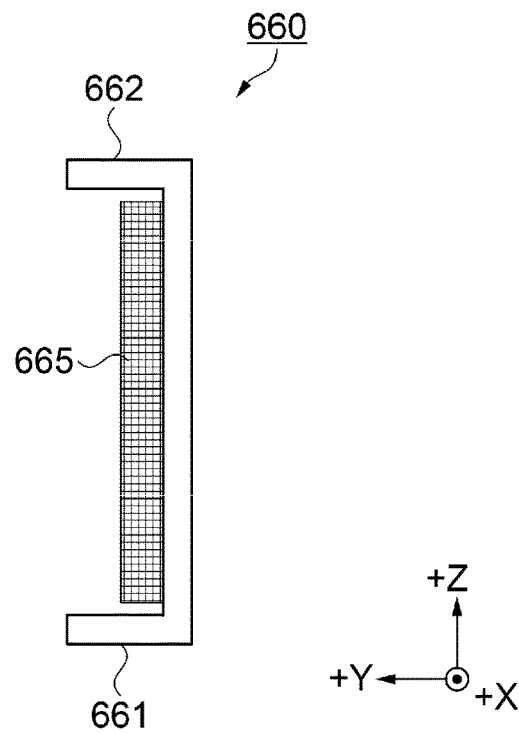
FIG. 10 is a side view showing a configuration of a plate like member according to a second embodiment.

FIG. 10 is a side view showing a configuration of a plate-like member 660 related to the second embodiment. Here, FIG. 10 shows a side surface of the plate-like member 660 viewed from the +X direction. As shown in FIG. 10, the plate-like member 660 has an evaporation promoter 665 having a mesh-like shape. The plate-like member 660 in the present embodiment is different in the point that the evaporation promoter 665 having the mesh-like shape is provided instead of the evaporation promoter 645 from the plate-like member 640 in the first embodiment, and substantially the same in the other configuration.

The groove member in the present embodiment includes a plurality of the plate-like members 660 arranged side by side along the ±Y directions as the predetermined directions. Each of the plate-like members 660 has a bent part 661, a connecting part 662, and the evaporation promoter 665. A −Z direction side of the bent part 661 is coupled to the bottom surface inside the housing 61, in other words, the bottom surface part 61B of the housing 61 as the heat receiver.

The groove member not shown is constituted by the bent part 661 of one of the plate-like members 660 and another of the plate-like members 660 adjacent to the one of the plate-like members 660 coupled to each other. On this occasion, the connecting part 662 of the one of the plate-like members 660 and the another of the plate-like members 660 adjacent to the one of the plate-like members 660 are also coupled to each other. As a method of coupling the plate-like members 660 adjacent to each other, there can be adopted swage working using the connecting part 662 and so on.

The evaporation promoter 665 has a substantially rectangular shape elongated in the ±X directions in the plan view viewed from the +Y direction. The evaporation promoter 665 is attached to the region on the +Y direction side in the plate-like member 660 with the long sides extending along the ±X directions and the short sides extending along the ±Z directions. The length of the long side of the evaporation promoter 665 is substantially the same as the length along the ±X directions of the plate-like member 660. The length of the short side of the evaporation promoter 665 is slightly shorter than the length along the ±Z directions of the plate-like member 660. The thickness along the ±Y directions of the evaporation promoter 665 is slightly smaller than a half of the distance between the plate-like members 660 adjacent to each other in the groove member. As the evaporation promoter 665, there are used members made of metal such as copper having thermal conductivity and processed so as to have a mesh-like shape. The evaporation promoter 665 is attached by brazing.

Figure 11:
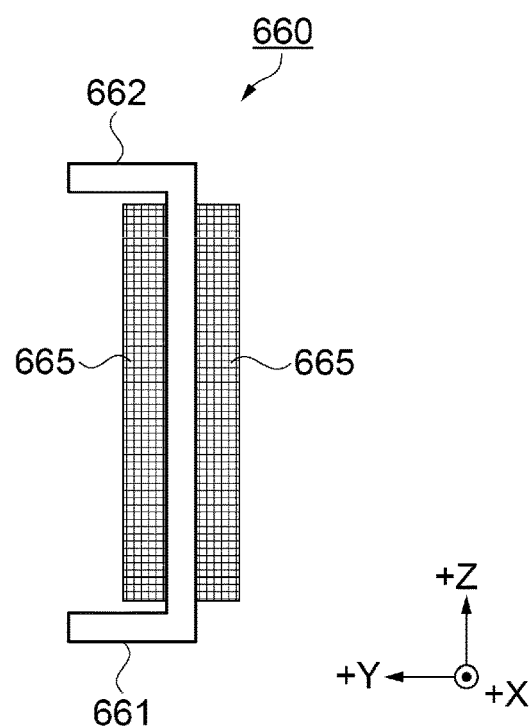
FIG. 11 is a side view showing a configuration of the plate like member.

The number and the arrangement of the evaporation promoters 665 are not limited to the above. Here, a different arrangement of the evaporation promoters 665 will be described with reference to FIG. 11. FIG. 11 is a side view showing a configuration of the plate-like member 660. As shown in FIG. 11, as a different arrangement of the evaporation promoters 665, it is also possible to dispose the evaporation promoter 665 also in a region on the −Y direction side of the plate-like member 660 in addition to the region on the +Y direction side of the plate-like member 660. According to this configuration, it is possible to further increase the contact area between the working fluid in the liquid phase and the groove member with respect to the evaporation promoter 665 in FIG. 10.

The evaporation promoter 665 can be provided to at least one of the plate-like members 660. Due to the evaporation promoter 665, the surface area of the plate-like member 660 facing the vapor flow channel increases, and thus, the contact area between the working fluid in the liquid phase and the groove member further increases.

As described hereinabove, according to the evaporation promoter 665 related to the second embodiment, substantially the same advantages as those of the first embodiment can be obtained.

Hereinafter, the contents derived from the embodiments will be described.

A cooler includes an evaporator configured to evaporate working fluid in a liquid phase with a heat transferred from a cooling target to change to the working fluid in a gas phase, a condenser configured to condense the working fluid in the gas phase to change to the working fluid in the liquid phase, a vapor pipe configured to make the working fluid changed in phase to the gas phase in the evaporator flow into the condenser, and a liquid pipe configured to make the working fluid changed in phase to the liquid phase in the condenser flow into the evaporator, wherein the evaporator includes a housing which is coupled to the liquid pipe, and into which the working fluid in the liquid phase inflows, a wick disposed in the housing, soaked with the working fluid in the liquid phase, and configured to transport the working fluid in the liquid phase, and a groove member having a plurality of vapor flow channels through which the working fluid changed in phase from the liquid phase to the gas phase flows, and coupled to the wick, the housing includes a heat receiver to which the heat is transferred from the cooling target, the groove member includes a plurality of plate-like members made of metal, arranged side by side along a predetermined direction, and constituting the plurality of vapor flow channels, and each of the plate-like members includes a bent part formed by bending a part of the plate-like member, and coupled to the heat receiver.

According to this configuration, in the cooler of the loop heat pipe type, it is possible to achieve both of the decrease in thermal resistance and the increase in amount of heat which can be cooled. In detail, the groove member is constituted by the plurality of plate-like members. Therefore, it becomes easy to form the vapor flow channel large in depth which is difficult to form by cut working. Further, since the plurality of plate-like members are arranged side by side in the predetermined directions, it becomes possible to make the depth of the vapor flow channel large, and at the same time to make the distance between the plate-like members adjacent to each other small to make the pitch between the plate-like members adjacent to each other small. Thus, since the surface area of the plate-like member increases, and the evaporation area of the working fluid in the liquid phase increases, it is possible to increase the amount of heat which can be cooled. Further, since the depth of the vapor flow channel is made relatively large to thereby make the cross-sectional area of the vapor flow channel relatively large, it is possible to reduce the pressure loss when the working fluid in the gas phase flows through the vapor flow channel, and further, it is possible to suppress the increase in evaporation temperature of the working fluid to decrease the thermal resistance of the loop heat pipe. Therefore, it is possible to improve the cooling performance of the cooler compared to the related art. In other words, it is possible to provide the cooler of the loop heat pipe type improved in cooling performance compared to the related art.

In the cooler described above, the plurality of plate-like members may be higher in thermal conductivity than the wick.

According to this configuration, the working fluid in the liquid phase becomes difficult to evaporate inside the wick, and becomes to evaporate mainly in the groove member constituted by the plurality of plate-like members. In other words, since the contact area between the working fluid in the liquid phase and the groove member constituted by the plurality of plate-like members increases to thereby increase the evaporation area of the working fluid, it is possible to increase the amount of heat which can be cooled, and thus, it is possible to further improve the cooling performance of the cooler.

Further, since the working fluid in the liquid phase is difficult to evaporate inside the wick, the working fluid in the gas phase migrating inside the wick decreases. In other words, since the working fluid in the gas phase migrates mainly through the vapor flow channel formed of the groove member as a result, the pressure loss of the working fluid in the gas phase, namely the pressure loss of the vapor, is reduced. Thus, it becomes possible for the working fluid in the liquid phase to evaporate at relatively low temperature, and the cooling performance is further improved.

In the cooler described above, the plate-like member may have a rectangular shape having long sides and short sides, the bent part may be disposed on one of the long sides, another of the long sides may be coupled to the wick, and a length of the short sides may be larger than a distance at which the plurality of plate-like members are arranged side by side along the predetermined direction.

According to this configuration, the distance at which the plurality of plate-like members are arranged side by side, namely the distance between the plate-like members adjacent to each other, becomes smaller, and at the same time, the depth of the vapor flow channel becomes deeper. Thus, the contact area between the working fluid in the liquid phase and the groove member is further increased, and it is possible to further improve the cooling performance of the cooler.

In the cooler described above, the groove member may be constituted by the bent part of one of the plate-like members and another of the plate-like members adjacent to the one of the plate-like members coupled to each other.

According to this configuration, the plate-like members adjacent to each other are coupled to each other via the bent part. Therefore, it becomes easy for the heat to propagate between the plurality of plate-like members, and it becomes possible to further improve the cooling performance.

In the cooler described above, an evaporation promoter configured to increase the contact area between the working fluid in the liquid phase and the groove member may be provided to at least one of the plurality of plate-like members.

According to this configuration, in the evaporation promoter, it becomes easy for the working fluid in the liquid phase to widely spread to wet the evaporation promoter to form a film, and thus, the evaporation area of the working fluid further increases. As a result, it is possible to further increase the amount of heat which can be cooled, and it is possible to further improve the cooling performance of the cooler.

In the cooler described above, the evaporation promoter may include a groove.

According to this configuration, the surface area of the plate-like member increases due to the groove, and further, since the working fluid in the liquid phase spreads to wet the groove due to the capillary force of the groove, it is possible to further increase the contact area between the groove member and the working fluid in the liquid phase.

In the cooler described above, the evaporation promoter may have a mesh-like shape.

According to this configuration, since the evaporation promoter has the mesh-like shape, the surface area of the plate-like member increases, and further, since the working fluid in the liquid phase spreads to wet the mesh due to the capillary force of the mesh, it is possible to further increase the contact area between the groove member and the working fluid in the liquid phase.

A projector includes a light source device having a light source configured to emit light, a light modulator configured to modulate light emitted from the light source device, a projection optical device configured to project the light modulated by the light modulator, and any one of the coolers described above.

According to this configuration, it is possible to efficiently cool each of the devices provided to the projector with the cooler improved in the cooling performance. Further, the cooler is improved in cooling performance, and therefore becomes easy to be reduced in size.

In the projector described above, the cooling target may be the light source.

According to this configuration, it is possible to efficiently cool the light source with the cooler improved in the cooling performance.

What is claimed is:

1. A cooler comprising:
an evaporator configured to evaporate working fluid in a liquid phase with a heat transferred from a cooling target to change to the working fluid in a gas phase;
a condenser configured to condense the working fluid in the gas phase to change to the working fluid in the liquid phase;
a vapor pipe configured to make the working fluid changed in phase to the gas phase in the evaporator flow into the condenser; and
a liquid pipe configured to make the working fluid changed in phase to the liquid phase in the condenser flow into the evaporator,
wherein the evaporator includes:
a housing which is coupled to the liquid pipe, and into which the working fluid in the liquid phase inflows
a wick disposed in the housing, soaked with the working fluid in the liquid phase, and configured to transport the working fluid in the liquid phase, and
a groove member having a plurality of vapor flow channels through which the working fluid changed in phase from the liquid phase to the gas phase flows, the groove member coupled to the wick,
the housing includes a heat receiver to which the heat is transferred from the cooling target,
the groove member includes a plurality of plate-like members made of metal, arranged side by side along a predetermined direction, and constituting the plurality of vapor flow channels,
each of the plurality of plate-like members includes a bent part formed by bending a part of a respective one of the plate-like members, each bent part coupled to the heat receiver, each bent part configured to couple to another one of the plate-like members adjacent to the respective one of the plate-like members, and
each of the plurality of plate-like members includes a connecting part formed by bending another part of the respective one of the plate-like members, the connecting part configured to couple to the another one of the plate-like members adjacent to the respective one of the plate-like members.

2. The cooler according to claim 1, wherein
a thermal conductivity of the plurality of plate-like members are higher than a thermal conductivity of the wick.

3. The cooler according to claim 1, wherein:
each of the plurality of plate-like members has a rectangular shape having long sides and short sides,
each bent part is disposed on one of the long sides,
another of the long sides is coupled to the wick, and
a length of the short sides is larger than a distance at which the plurality of plate-like members are arranged side by side along the predetermined direction.

4. The cooler according to claim 1, wherein
an evaporation promoter configured to increase a contact area between the working fluid in the liquid phase and the groove member is provided to at least one of the plurality of plate-like members.

5. The cooler according to claim 4, wherein
the evaporation promoter has a groove.

6. The cooler according to claim 4, wherein
the evaporation promoter has a mesh-like shape.

7. A projector comprising:
a light source configured to emit light;
a light modulator configured to modulate the light emitted from the light source;
a projection optical device configured to project the light modulated by the light modulator; and
the cooler according to claim 1.

8. The projector according to claim 7, wherein
the cooling target is the light source.

9. A cooler comprising:
an evaporator configured to evaporate working fluid in a liquid phase with a heat transferred from a cooling target to change to the working fluid in a gas phase;
a condenser configured to condense the working fluid in the gas phase to change to the working fluid in the liquid phase;
a vapor pipe configured to make the working fluid changed in phase to the gas phase in the evaporator flow into the condenser; and a liquid pipe configured to make the working fluid changed in phase to the liquid phase in the condenser flow into the evaporator,
wherein the evaporator includes:
a housing which is coupled to the liquid pipe, and into which the working fluid in the liquid phase inflows, a wick disposed in the housing, soaked with the working fluid in the liquid phase, and configured to transport the working fluid in the liquid phase, and a groove member having a plurality of vapor flow channels through which the working fluid changed in phase from the liquid phase to the gas phase flows, the groove member coupled to the wick, the housing includes a heat receiver to which the heat is transferred from the cooling target, the groove member includes a plurality of plate-like members made of metal, arranged side by side along a predetermined direction, and constituting the plurality of vapor flow channels, each of the plate-like members includes a main body, has a rectangular shape having long sides and short sides, and transports the working fluid of the liquid phase from the wick to the heat receiver, each of the plurality of plate-like members includes a bent part provided to an end of the main body of a respective one of the plate-like members, each bent part configured to couple to another one of the plate-like members adjacent to the respective one of the plate-like members, and the main body has an evaporation promoter, provided from one end side of one short side of the short sides of the rectangular shape of the main body to another end side of the one short side, spreading the working fluid in the liquid phase toward the heat receiver due to capillary force.

10. The cooler according to claim 9, wherein each bent part is coupled to the heat receiver.

11. The cooler according to claim 9, wherein each bent part includes the evaporation promoter.

* * * * *